United States Patent [19]

Blesser

[11] 4,375,081
[45] Feb. 22, 1983

[54] MULTISTAGE DIGITAL FILTERING UTILIZING SEVERAL CRITERIA

[75] Inventor: Barry Blesser, Raymond, N.H.

[73] Assignee: Pencept, Inc., Waltham, Mass.

[21] Appl. No.: 213,583

[22] Filed: Dec. 5, 1980

[51] Int. Cl.³ .............................................. G06F 15/31
[52] U.S. Cl. .................................... 364/724; 364/734; 340/146.3 J
[58] Field of Search ............... 364/724, 734, 572, 575, 364/811, 825; 340/146.3 J, 900

[56] References Cited

U.S. PATENT DOCUMENTS

| 3,772,502 | 11/1973 | Hodge et al. | 364/811 X |
| 3,787,827 | 1/1974 | Stout | 364/900 X |
| 3,908,116 | 9/1975 | Bjornsen | 364/724 X |
| 3,946,211 | 3/1976 | Jenkins, Jr. | 364/572 |
| 4,054,786 | 10/1977 | Vincent | 364/575 |
| 4,153,896 | 5/1979 | White | 364/811 X |
| 4,193,118 | 3/1980 | Nash et al. | 364/734 |
| 4,317,182 | 2/1982 | Jakase et al. | 364/734 |

Primary Examiner—David H. Malzahn
Attorney, Agent, or Firm—Hane, Roberts, Spiecens & Cohen

[57] ABSTRACT

Apparatus for filtering a sequence of digital values representing a stroke of a stylus on a tablet averages sets of digital values, resamples the averaged digital values to accept only those having greater than a minimum amplitude separation and then averages sets of the resampled digital values.

12 Claims, 7 Drawing Figures

SCANNER 32/SUBTRACTOR 34/COMPARATOR 38/SCANNER 40

MULTISTAGE DIGITAL FILTERING UTILIZING SEVERAL CRITERIA

BACKGROUND OF THE INVENTION

This invention pertains to digital filtering and more particular to multistage filtering based on more than one criterion.

In many applications, a digitizing tablet is used to convert the pen or stylus motion into a set of electrical data which can be processed by digital equipment. Typically, there would be a special electronic or electromagnetic surface which is able to detect the X-Y position of the pen at a periodic rate. This information is present as two digital data words at a periodic clock rate. This class of technology is used for signature verification, automatic drafting, character recognition, etc. In each case, the user writes with the electronic pen and the position is monitored electronically.

In connecting such a device directly to a recognition processor there are problems because the raw data contains cetain kinds of noise and other defects. The raw data contain noise which must be minimized by smoothing or filtering. In this problem, however, there are two different kinds of noise. There is the usual electrical noise such that a stationary pen will not give the same value each time due of random fluctuations in the sensing medium. Secondly, there is a "natural" noise produced by the human writer when he is writing slowly. If one looks at a human drawn line with a magnifying glass, one sees that the line contains many wiggles. This is especially true for slowly drawn lines.

When a line is drawn slowly, there is a very large amount of data even though there is very little information. It is very desirable and often required to perform data reduction. Consider a system which samples the x-y values at a rate of 120 per second in order to follow very fast motion. A given line written slowly could generate from 50 to 100 points whereas the same line written rapidly could generate only 10 to 20 points.

BRIEF SUMMARY OF THE INVENTION

It is a general object of the invention to reduce both the electrical and "natural" noise in a series of indicia representing a signal.

Briefly the invention contemplates filtering a signal represented by a first series of indicia wherein each indicium of the series represents an amplitude by serially averaging the amplitudes of sets of n indicia of the series to form a second series of indicia and serially amplitude comparing each subsequently occurring indicium of the second series with a previously occurring indicium thereof to form a third series of indicia which includes those indicia resulting from comparisons having an amplitude difference greater than a predetermined amount.

In addition, according to a feature of the invention methods and apparatus are provided to fix the end points of the original series all through the operation.

BRIEF DESCRIPTION OF THE DRAWING

Other objects, the features and advantages of the invention will be apparent from the following detailed description when read with the accompanying drawing which shows apparatus for carrying out the invention. In the drawing.

DETAILED DESCRIPTION OF THE PREFERRED EMBODIMENTS OF THE INVENTION

Figure 1:
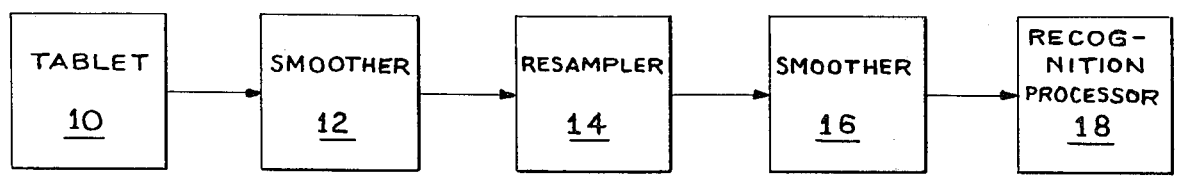
FIG. 1 shows a block diagram useful in explaining the invention.

In FIG. 1 there is shown a system composed of: a writing tablet 10 which periodically emits digital values related to positions of a stylus or pen on its writing surface; filtering means including, serially connected, a first smoother 12, a resampler, 14 and a second smoother 16; and a recognition processor 18.

The tablet 10 will periodically emit two dimensional values representing the x and y positions of the stylus. The first smoother 12 is a two dimensional lowpass filter which averages the data from the tablet in a running average. This operation reduces the electrical noise since the averaging takes place over a fixed number p of points. This reduces the electrical noise in the data. Note this averaging is in terms of time since a fixed number of points corresponds to a fixed time interval. Further since this operation reduces the bandwidth of the data, the data can be resampled in the space domain. The resampler 14 discards points which are too close together. Hence, it only keeps points which are spaced more than some threshold amount K. The resampler 14 thus creates a space sampling rather than a time sampling.

The smoother 16 performs another averaging or lowpass operation which smoothes data in the space domain rather than in the time domain.

Thus, the entire system can be viewed as a dual filtering, once in the time domain to remove electrical noise, and once in the space domain to remove spatial ("natural") noise. Hence, there is a new filtering which varies with the writing speed. Rapidly drawn lines are filtered by both smoothers 12 and 16 as if they were in simple cascade with no resampler. Rapidly drawn lines have a spaced between points which is greater than the threshold. Hence, the resampler 14 does nothing. Slowly drawn lines are filtered in the space domain by the second smoother 16.

In general, the second smoother 16 will cover a fixed spatial distance depending on the fineness of the detail which needs to be preserved. The first smoother 12 will be designed on the basis of the electrical noise which is present.

To further understand the operation, there will be discussed various cases where one or more sections of the processing were absent. From hereon, only one of the x-y dimensions will be considered since the same occurs for the other. If the first smoother 12 were not used, then the electrical notes on the raw data might result in neighboring points being physically separated by an amount which was larger than the resampling threshold. Consider a set of raw data in the X-dimension only of the form: 1,3,0,-1,0, 1, 2, 0, 4, 3, etc. which might arise from a pen fixed at a distance of 1 from a reference point. The variability was from electrical noise. If the resampler threshold were 2 units, then the resampler would treat this data as a moving pen. The result of resampling would be 1,3,0,2,0,4, etc. even though the pen were not moving. The lack of a smoother gives the appearance of motion which passes the resampler. Now consider a 5-point averager for smoother 12 which performs the first smoothing operation. The resulting data would be 0.6, 0.6, 0.4, 0.6, 1.4, 2.0, etc. The resampler 14 would give only a single point of 0.6 since none of the other points are more than 2 unit from this. Hence a stationary pen gives a single data point from the resampler.

Figure 2:
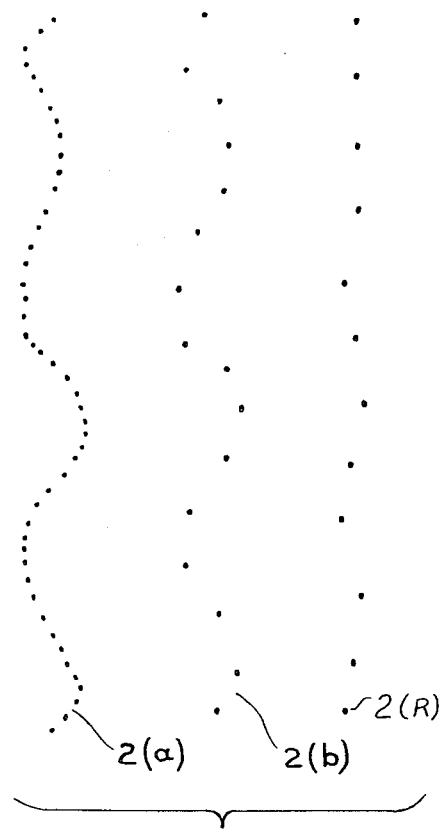
FIG. 2 are waveforms useful in explaining the invention.

Now consider the case of no second smoothing operation with a slowly drawn line as shown in waveform 2a of FIG. 2. The wiggles or noise are spatial, a result from the way that the writer has drawn the line. The first smoother 12 will not remove these wiggles since it averages over a very small region in space. The output from the first smoother 12 will look essentially like the original data. The resampler 14 removes many points to give the waveform 2b which can be smoothed and contains all of the space noise of the original. Waveform 2R is the resampled data after smoothing by a smoother 16.

If the resampler 14 is removed then a stationary pen will result in a fixed amount of data per second and the recognition processor 18 will eventually overflow. Hence, some data reduction must be performed.

Finally consider the end points of a line which often take on a special meaning. Average and smoothing operation tend to pull the end points. In general a point will not get "pulled" if it is averaged with points on both sides of it. However, with the end points there is no point before the beginning nor any point after the end.

To overcome this limitation, the end points of a line are treated somewhat differently. In the initial raw data, the first and last points are repeated n times where n is the span of the first smoother 12. If the smoother 12 covers four points, then the first data point is repeated four times and the last data point is repeated four times. Thus the first and last averaging will be the end points themselves. The resampler 14 automatically takes the first and last points. And finally, the second smoother 16 also has the ends repeated. Note that the span of the first and second smoother need not be the same. The first smoother 14 can cover four points while the second smoother 16 covers two points, or vice versa for example.

Figure 3:
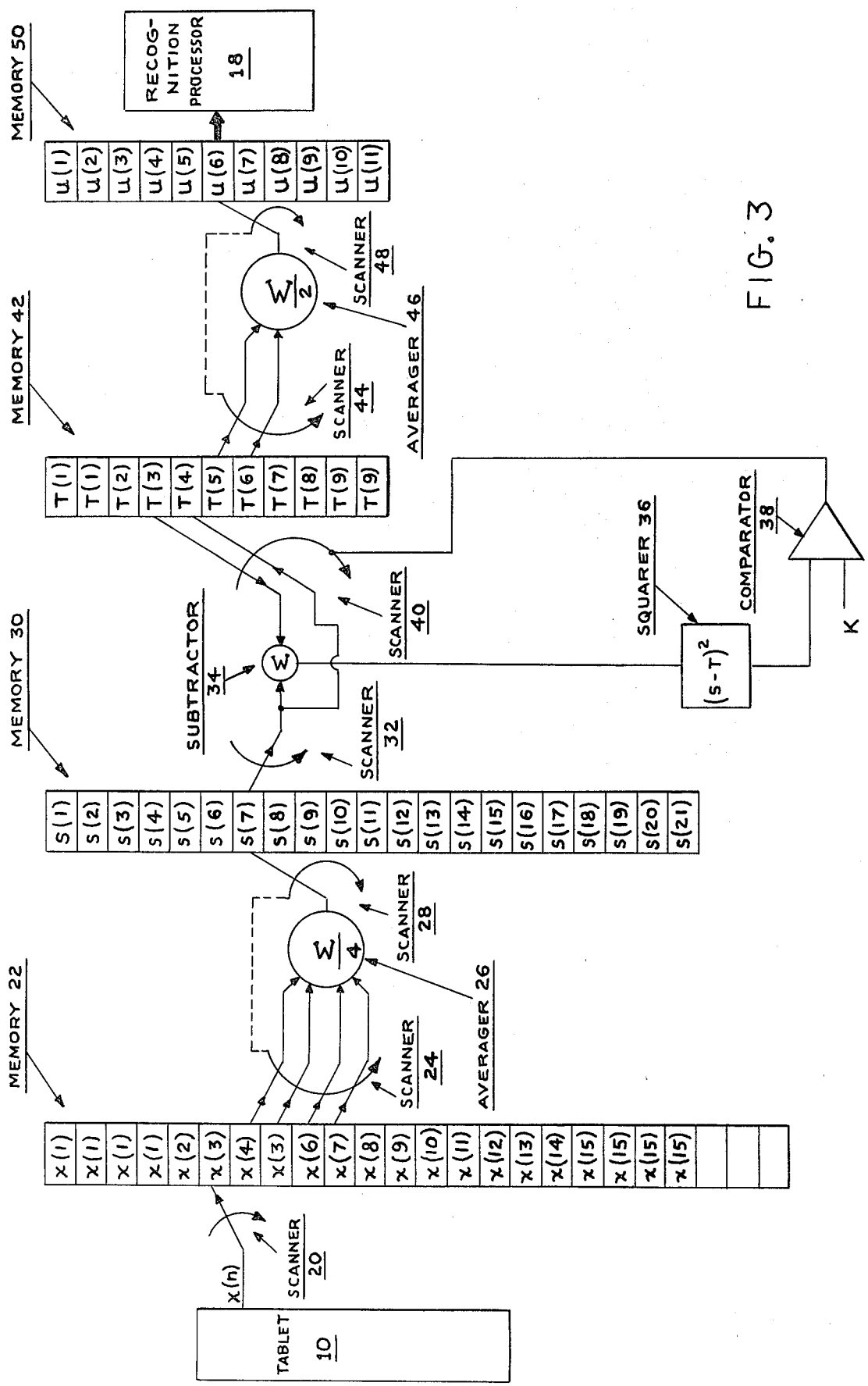
FIG. 3 is a generalized logic diagram of that shown in FIG. 1.

In FIG. 3 there is shown a generalized system diagram which implements the invention. A tablet is used to transform the X-value of a stylus pen tip into a digital value which becomes the output of the tablet. These values appear at a periodic rate in order to follow any motions of the pen tip. In the present discussion only the X-values of the tablet 10 are shown but, in general, there will also be a corresponding sequence of Y-values. The index n represents the time sequence. Hence, x(1) and y(1) represent the x and y positions of the pen tip at a first clock pulse. Correspondingly, x(2) and y(2) represent the values at the second clock pulse. The pulse rate of the clock is selected on the basis of the expected velocity of the pen motion. For typical writing speeds, the clock rate will be on the order of 50 to 150 samples per second.

The first value at n=1, is feed by a scanner 20 to the first four locations of memory 22. Succeeding input samples are stored in successive locations of memory 22 by means of the scanner 20. The last sample is stored in the last four locations. The example in FIG. 3 shows the X-value for fifteen input data points which are stored in twenty one cells of memory 22. This is the raw unprocessed data.

The data in memory 22 is smoothed by extracting four data points (neighboring) using a scanner or commutator 24 and an averager 26 with the result stored in temporary memory 30 through the agency of scanner 28. On the first step of this operation, the four outputs of scanner 24 are set to the first four cells of memory 22. The average of these is the same as their values since the first four locations each have the same value x(1) in them. The result is stored in the first location of a memory 30 as point s(1). On the next step, both scanners 24 and 28 are advanced one step. Thus, the averager 26 will create the average of x(1), x(1), x(1) and x(2) by adding and dividing by four. The result is stored as s(2) in the next cell of memory 30. This set of operations continues until all data points are smoothed. There will be twenty one smoothed data points corresponding to the fifteen input points since the end points were repeated. This makes the end points of the smoothed memory s(1) and s(21) be the same as the original end points x(1) and x(15).

The first smoothing has been accomplished by elements 24, 26, 28 and 30. Now the resampling is performed by transferring data from memory 30 to memory 42 subject to the condition that the data in memory 42 has all neighboring points separated by an amount K. The first two cells of memory 42 are loaded with the contents of the first cell of memory 30. Scanners 32 and 40 are set to the initial values. The upper leg of scanner 40 reads out the first data point T(1) in memory 42 and this is subtracted from the first data point s(1) in memory 30, the difference is created in subtractor 34, squared in squarer 36 and compared to the threshold in comparator 38. If the result was below threshold, then scanner 40 is not advanced; if it is above threshold, then this scanner is advanced. Scanner 32 is always advanced on each cycle. If the first operation, points s(1) and T(1) are the same by definition and scanner (40) will not be advanced.

On the next step, scanner 32 selects the contents of the second cell of memory 30, i.e., s(2) but scanner 40 is still selecting T(1). The squared difference is again compared to the threshold. If it is still below, the process repeats. Eventually, there will be value from memory 30 which results in a computation over the threshold. Consider for example that s is greater than K. Both scanners advance. The value from scanner 32 is passed to the lower part of scanner 40 and the value is placed into the next cell of memory 42.

In this way, the data in memory 42 will be a subset of the data in the memory 30 with the condition that no neighboring points are closer together than the amount K. This act of resampling will result in less data in memory 42 if the data is generally closer together than the amount K.

In the last phase of this resampling operation, the last two points in memory 42 are made equal to the last point in memory 30. This is an added point which corresponds to T(9)=s(21) in this example.

Following the resampling operation, there is a last smoothing similar to the first smoothing except that the operation is on the resampled data. The second smoother is basically scanner 44, averager 46 and scanner 48. Scanner 44 reads out y values and produces an average in averager 46 and the result is placed into memory 50 by scanner 48. On each step the scanners advance one step and the process repeats until the complete sequence has been smoothed. The first and last points of memory 50 will be the same as those in memory 42 because they have been repeated two times.

Figure 4:
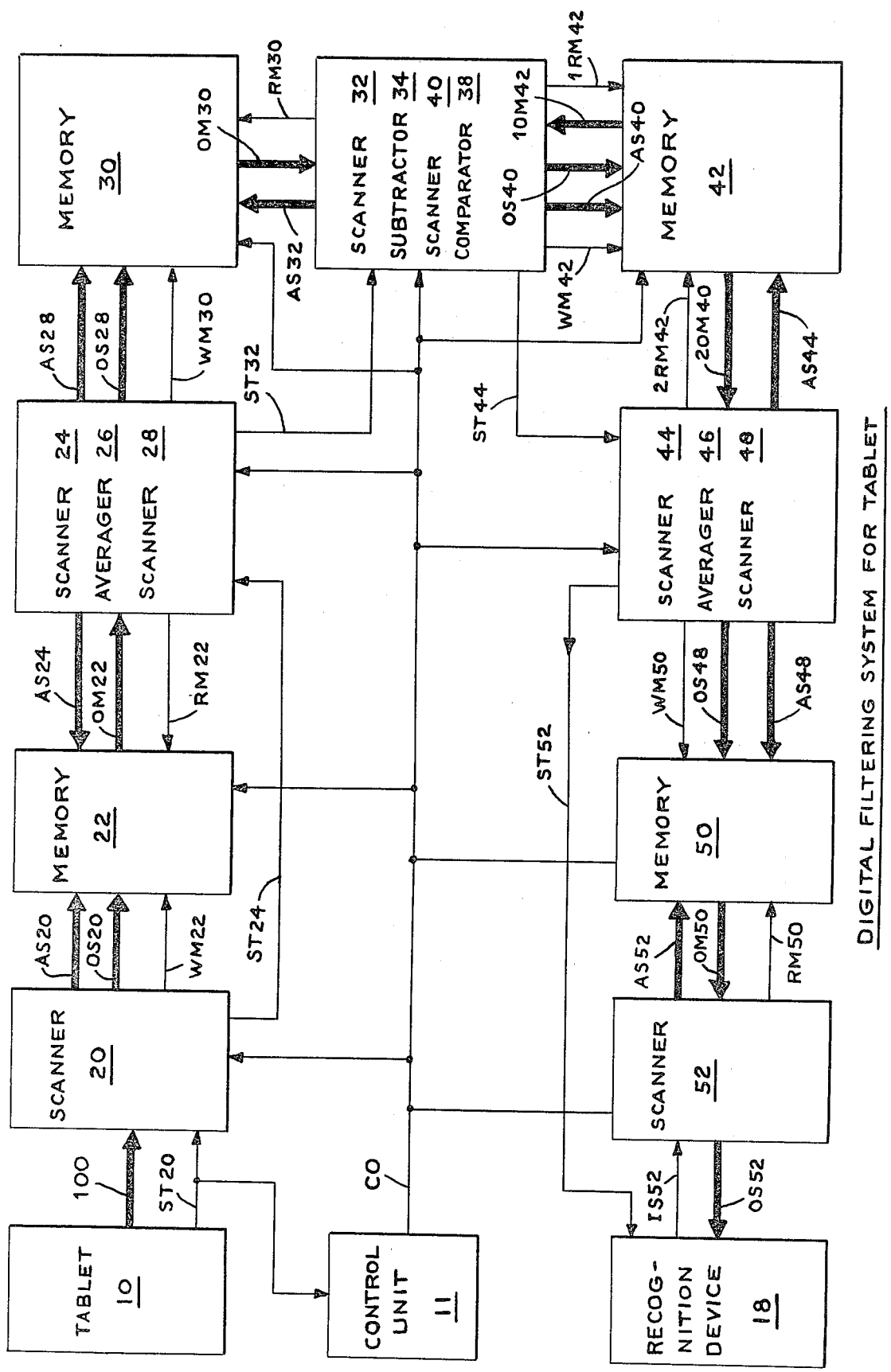
FIG. 4 is a detailed logic diagram of the system shown in FIG. 3.

FIG. 4 again shows the system wherein the tablet 10 periodically emits an X-value on line 100 and a pulse on line ST20 as long as a stylus or pen is in contact with the tablet. (The X-value represents the X-position of the stylus on the tablet; it also would emit a Y-value, but since the filtering of y-values is the same and done by parallel equipment or multiplexing with the same equipment it will not be discussed). The pulse signal on line ST20 is also fed to a control unit 11 which will emit a pulse on line CO if no pulse is received from line ST20 for a given period time indicating that the stylus is not near the tablet surface.

In such case a stroke is finished and the filterer must be cleared for the next stroke.

The X-values on cable 100 are loaded into sequential cells of memory 22 by scanner 20. Memory 22 can be a random-access memory which loads a word present on cable OS20 into the address present on cable AS20 when a write pulse is emitted on line WM22 from scanner 20. (The cells of the memory are initially cleared by the pulse on line CO). The scanner 20 is so arranged that the first X-value is written into the first four sequential cells and the last X-value is written into the last four sequential cells of memory 22.

The Scanner 24 is activated by pulses on line ST24 to sequentially read the cells of the memory 22 by feeding addresses thereto on cable AS24 and read pulses on line RM22. The read X-values are transmitted to the scanner 24 on cable OM22. The X-values in overlapping sets of four are arithmetically averaged by the averager 26 and the averages are fed to sequential cells to random-access memory 30. Scanner 28 sequentially generates the addresses on cable AS28 and a write pulse for each address on line WM30. The average X-values of the new series are fed to the memory 30 via cable OS28. (Memory 30 which can be a random-access memory is initially cleared by the pulse on line CO).

In general the scanner 32 is activated by a pulse on line ST32 to read out an X-value from the memory 30 as defined by an address on cable AS32 in response to a read pulse on line RM30. The X-value is presented to the minuend input of subtractor 34. The X-value is also writen into a cell n of memory 42 selected by an address on the lines of cable AS40 and a write pulse on line WM42 generalized by scanner 40. Then scanner 40 readout the X-value in cell n-1 to the subtracted input of the subtractor 40 which performs the subtraction. The difference is compared in comparator 38 with a fixed value. If the difference is less than the fixed value the X-value written into cell n is effectively discarded. This is accomplished by setting the scanner 40 to the access cell n again. The difference is compared in comparator 38 with a fixed value. If the difference is greater the X-value written into cell n is retained. This is accomplished by setting the scanner 40 to access cell n+1 of memory X2. In addition, the sequences of cell selection by scanner 40 is designed such that the first X-value read from memory 30 is written into the first two cells of memory 42 and the last X-value read from memory 30 is written into the two successive end cells of the cell sequence of memory 42.

The pulse on line ST44 activates scanner 44 which reads in the contents of two successive memory cells via the lines of cable 20M42 by emitting successive pulse of line 2RM42 and two sequential addresses such as n and n+1 on the lines of cable AS44. The averaging is performed and sent via the lines of cable OS48 to the cell in memory 50 indicated by the address signals on the lines of cable AS48 when a write pulse is emitted on line WM50.

The scanner 48 then emits a pulse of line ST52 to indicate to recognition device 18 to start stepping the scanner 52. Each time device 18 emits a pulse on line IS52 in response to a pulse of line ST52 scanner 52 emits an address on the lines of cable AS52 to memory 50 along with a read pulse on line RM50. In response thereto memory 50 emits a word on the lines of cable OM50 which passes via scanner 52 and cable OS52 to recognition device 18.

In this manner the X-values are filtered and loaded into the recognition device 18.

Figure 5:
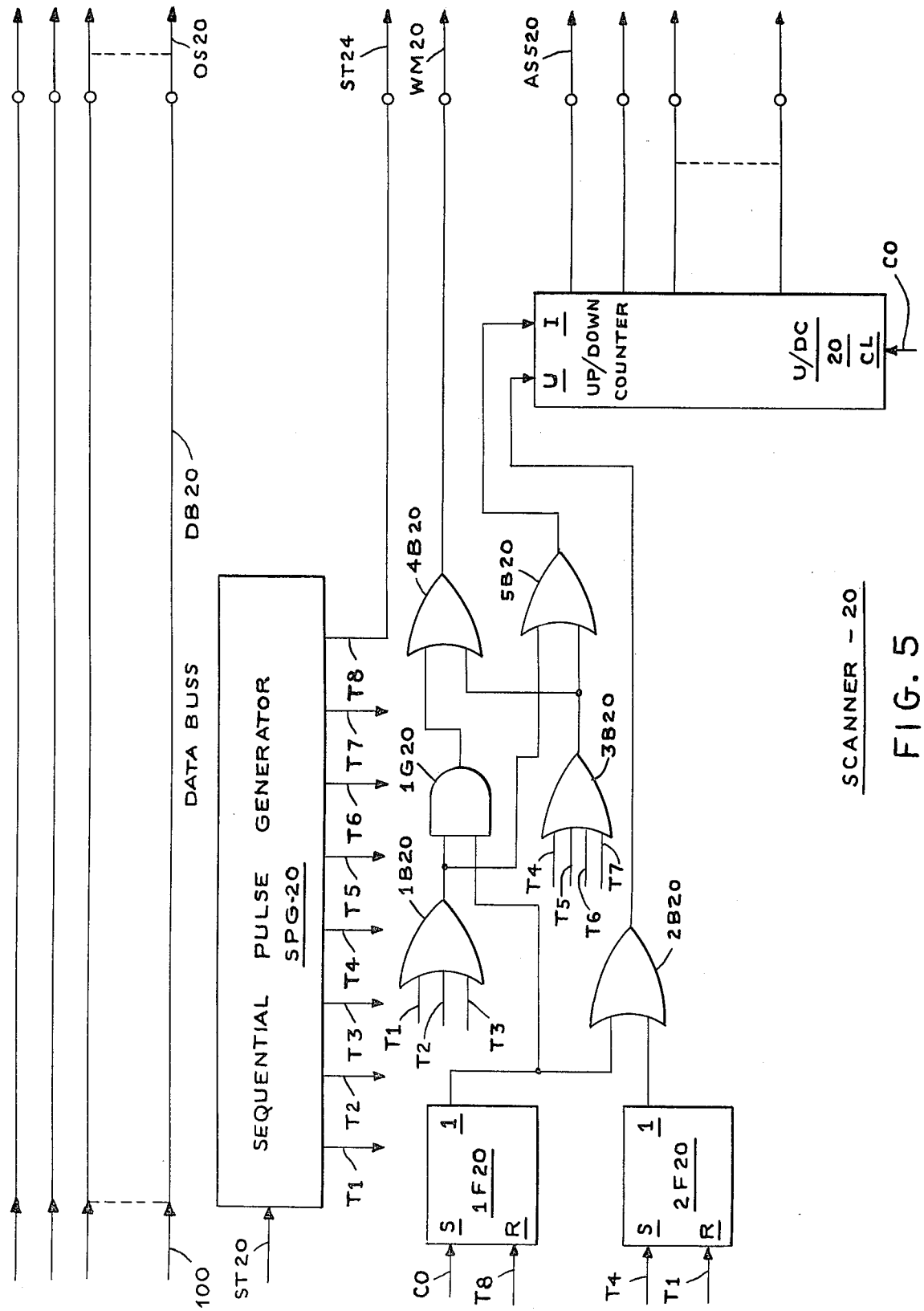
FIG. 5 is a detailed logic diagram of the scanner 20 of the system shown in FIG. 4.

The scanner 20 shown in FIG. 5 includes a bus which connects the multi-lead cable 100 from the tablet to the multi-lead cable OS20 connected to the memory 22.

There is also included the sequential pulse generator SPG20 which in response to a pulse on line ST20 from the tablet 10 emits a sequence of eight pulses one for each of the lines T1 to T8. The remainder of the scanner 20 is concerned with an address generator for generating the addresses of the memory cells which are to receive the X-values from the tablet 10. The addresses are generated by the up-down counter U/DC20. At the start of the transmission, the pulse on the line CO clears the counter to zero and sets the flipflop 1F20. The setting of the flipflop 1F20 alerts the AND-circuit 1G20 and switches the up-down counter U/DC20 into the up mode by connecting the 1-output of flipflop 20 via the OR-circuit 2B20 to the U-input of the counter U/DC20. Now, when the first pulse is received from the tablet 10 associated with the first X-value the series of signals on the lines T1 to T8 is generated. At time T1 a pulse passes from line T1 via OR-circuit 1B20 and OR-circuit 5B20 to the I-input of the counter incrementing it to a value f 1. The counter, therefore, generates the address of the first cell of the memory 20. At the same time, the pulse on line T1 passes through the AND-circuit 1G20 and the OR-circuit 4B20 to the write pulse line WM20 and the first X-value on the data bus DB20 is written into the first cell. When a pulse is emitted on line T2, there is a recording of this same X-value into the second cell—similarly, for the third pulse on line T3. At time T4, the pulse on line T4 passes through OR-circuit 3B20 and OR-circuit 5B20 to increment the count in the counter to a value of four generating the fourth address and, at the same time, the pulse on line T4 passes through the OR-circuit 3B20 and the OR-circuit 4B20 to become a write pulse. This continues until the pulse on line T7 with a writing of the same X-value in the seventh memory cell. When the pulse occurs on line T8, it clears the flipflop 1F20 and also emits a pulse on line ST24 to activate the scanner 24 for reading out of the memory.

When the second X-value is presented by the tablet 10 with a pulse on line ST20, it also causes the generation of another sequence of the eight timing signals. Note, however, for this X-value and all succeeding X-values, the flipflop 1F20 remains reset. With the flipflop 1F20 reset, the up-down control, i.e., the U-input of the up-down counter U/DC20, is controlled solely by the flipflop 2F20. (Note also the AND-circuit 1G20 is blocked.) At the time of the pulse on the line T1, the flipflop 2F20 is cleared, causing the up-down counter U/DC20 to act as a down counter. The pulse on line T1 also passes through the AND-circuit 1B20 and the AND-circuit 5B20 to decrement the address from a value of seven to a value of six. The same thing happens for the pulses on lines T2 and T3 so that just prior to the occurrence of the pulse on line T4, the count in the counter is for address four and there has been no write pulses generated on the line WM20. When the pulse occurs on line T4, it sets the flipflop 2F20, causing the counter U/DC20 to act as an up-counter. At the same time, the pulse on line T5 passes through the OR-circuit 3B20 to both the OR-circuits 4B20 and 5B20. The pulse from OR-circuit 4B20 causes a write pulse on line WM20 while the pulse from the OR-circuit 5B20 raises the address to a value of five. Thus, in address five there is written the second X-value. Similarly, for the pulses occurring on lines T5, T6 and T7, there is a writing of this second X-value in the cells address six, seven and eight. When the pulse on line T8 occurs, there is a step pulse fed on line ST24 to the scanner 24. Every X-value that follows initiates the same kind of X-cycle wherein the up/down counter is decremented by three followed by the writing of that X-value in the next four cells. This results in the fact that when the last X-value is written, that X-value is written in four cells. Thus, the scanner 20 takes the first X-value, writes it in the first four cells of the memory 22, then writes the following X-values in successive cells until it gets to the last X-value which is written in four cells of the memory 22.

Figure 6:
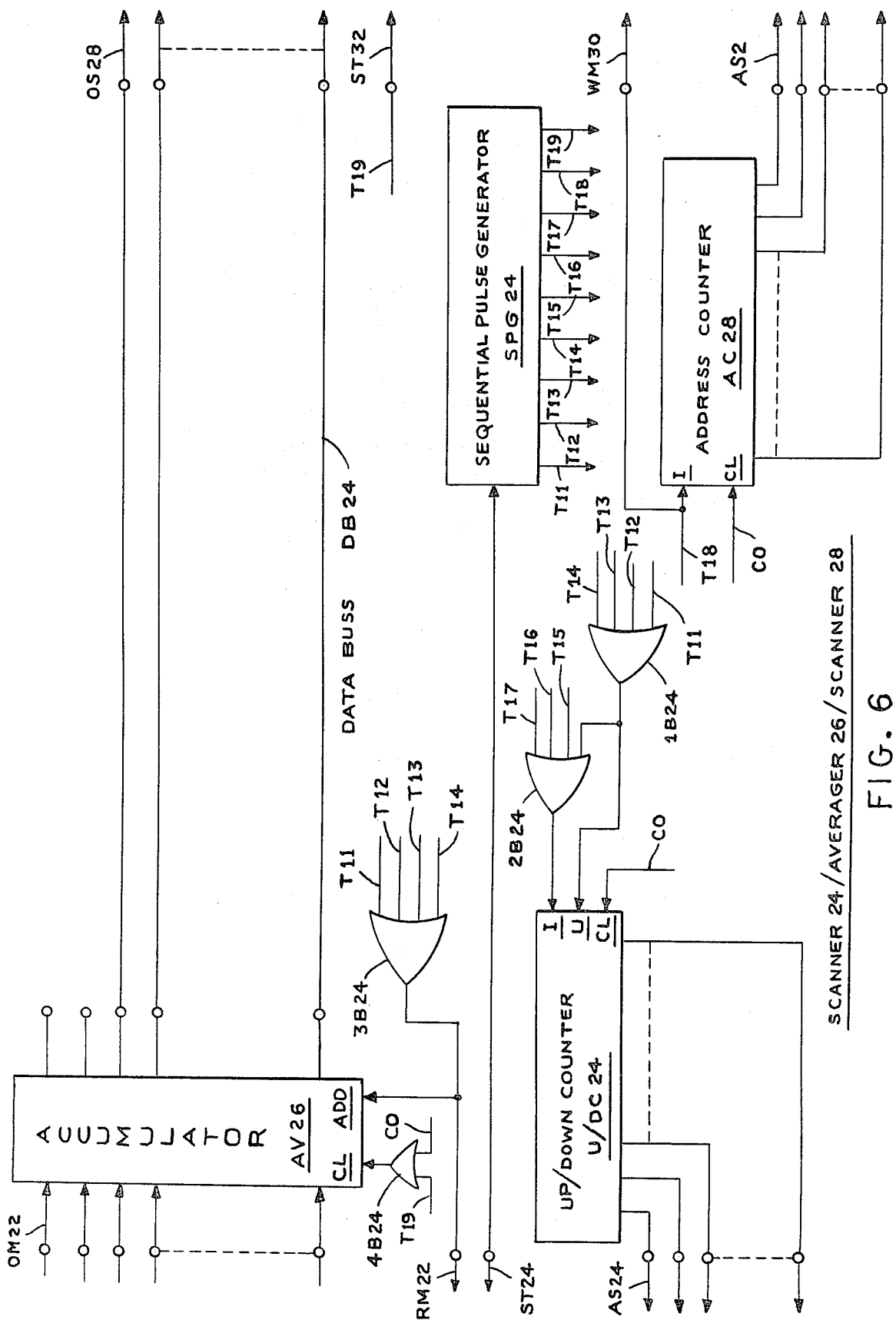
FIG. 6 is a detailed logic diagram of the scanner 24 average 26 and scanner 28 combination of FIG. 4.

The operation of the scanner 24, the averager 26 and the scanner 28 shown in FIG. 6 is controlled by timing pulses generated by sequential pulse generator SPG24 which is similar to sequential pulse generator SPG20 of FIG. 5 except that it is controlled to operate by a pulse on line ST24. In response thereto it emits a set of sequential pulses on lines T1 to T1. The scanner 24 centers around the up/down counter U/DC24. The up/-down counter is initially cleared to zero by the pulse on line CO and thereafter driven by timing pulses generated by the sequential pulse generator STG24. The count of the timing pulses in the up/down counter U/DC24 generates addresses which are fed by the cable AS24 to select the cells in the memory 22. The scanning is started by a pulse on line ST24 from the scanner 20. This pulse then triggers nine sequential pulses on the lines T1 to T9, respectively. The first four pulses, i.e., the pulses on lines T11, T12, T13 and T14, pass through the OR-circuit 1B24 to the U-input of the up/down counter. At the same time, these pulses also pass through the OR-circuit 2B24 to the I-input of said counter. Thus, the counter unit-increments four pulses and the addresses on the lines of cable AS24 go from initial value of zero to 1, 2, 3 and 4. At the same time, the pulses on the lines T11, T12, T13 and T14 pass through the OR-circuit 3B24 onto the line RM22 to send four sequential reading pulses to memory 22. In this way, the contents of the four successive cells are read from the memory 22. Then the pulses on the lines T15, T16, and T17 sequentially pass through the OR-circuit 2B24 to unit-decrement the count therein. Thereafter, during each cycle four memory cells are sequentially read, then the counter is stepped back to the equivalent of three memory cells. In this way, sets of four successive memory cells are read at a time wherein adjacent sets overlap for three cells.

The averager 26 centers around the accumulator AV26. In particular, the accumulator AV26 has a set of inputs connected in parallel to the lines of cable OM22 to receive the X-values from the four sequentially read cells. As the X-value of each cell is read in response to a pulse on line RM22, the same pulse activates the ADD-input of the accumulator so that a sum of the X-values is accumulated therein. It should be noted that at the end of the operation, a pulse on line T19 clears the contents of the accumulator (Initially the accumulator is cleared by a pulse on line CO). Therefore during each operation the four read-in X-values are summed. This sum is effectively divided by four by merely dropping the two least significant bit positions of the contents of the accumulator. Therefore, the remaining bit positions are connected, respectively, to the lines of cable OS28 so that this cable carries a value which is the arithmetic average of the four X-values read in at this time.

The scanner 28 centers around the address counter AC28, a conventional up-counter, which counts pulses on the line T18 fed to the I-input thereof. The counter is initially cleared to a count of zero by a pulse on line CO connected to the CL-input with the first pulse on line T18 initiating the first address along with a write pulse on the line WM30. The write pulse on line WM30 and the addresses on the table AS28 are fed to the memory 30 so that in this way for each cycle there is one averaged X-value written into the memory 30.

In FIG. 6, there is shown the combination of scanner 32, subtractor 34, comparator 38 and scanner 44. Again, this combination is clocked by pulses generated by sequential pulse generator SPG40 (similar to the other pulse generators) in response to a pulse received on line ST32. The pulses are generated on lines T31, T32, T33, T34, T35, T36 and T37.

The scanner 32 is effectively the address counter AC32 which is initially cleared to zero by a pulse on line CO connected to the CL-input and is thereafter stepped by the pulses on line ST32 connected to the I-input to generate the addresses which are fed by the lines of cable AS32 to the memory 30. The read pulses for the memory 30 are basically pulses on the line T31 which are fed to the line RM30.

The scanner 34 centers around the up/down counter U/DC40 which generates addresses fed via the lines of cable AS40 to the memory 42. The scanner also includes the flipflop 1F40 which is initially set by a pulse on line CO connected to the S-input and reset by a pulse on line T37 connected to the R-input. The 1-output of the flipflop 1F40 alerts AND-connect 1G40 via OR-circuit 4B40 to control the passage of pulses on line T36 to the OR-circuits 2B40 and 3B40 whose outputs are respectively connected to the I- and U-inputs of the counter. In addition, pulses on the lines T31 and T32 pass through the OR-circuit 1B40 to the line WM42 to control writing of the memory 40. The line T34 is connected to the line 1RM42 to control reading from the memory 42. The stepping of the counter is controlled by OR-circuit 2B40. The direction of the stepping is controlled by the OR-circuit 3B40. Signals from the OR-circuit cause the down-counter to up-count; otherwise, it would normally down-count.

The subtractor 34 mm can be a parallel subtractor which receives at its miuend input the signals on cable OM30 from the memory 30 and at its subtracted input the signals on cable 1OM42 from the memory 42. The difference is fed to one input of the comparator 38 whose other input receives a fixed value. If the different signal is greater than the fixed value (the minimum distance between two X-values) the comparator 38 emits a pulse on line KO whenever the minimum distance is exceeded.

In operation, the address generator AC32 calls in an X-value from the memory via the lines OM34. It is also presented to the lines of cable OS40. If this is the first X-value after the pulse on line CO, the counter 40 is set to a value of 1 and the flipflop 1F40 is set. The pulse on line T31 passes through OR-circuit 1B40 to become a write pulse on line WM42 and the first X-value from memory 30 is written into the first memory cell of memory 42. When the pulse occurs on line T43, another write pulse is generated on line WM40 by virtue of the pulse on line T32 at the input of OR-circuit 1B40. At the same time, the pulse on line T32 feeding the OR-circuit 2B40 causes the up-down counter 40 to unit increment. Therefore, the first X-value from memory 30 is also written into the second address of the memory 42. Upon the occurrence of the pulse on line T33, the up/down counter U/DC 40 is decremented to the first address value. When the pulse occurs on line T34, the up/down counter is again decremented to the zero address. The pulse on line T34 also goes out on the line 1RM42 to the memory 42 to cause a read. The contents of the zero address which at this time will include nothing is fed to the subtractor 34. When a pulse occurs on the line T35, the subtraction is performed and also the up/down counter is incremented to the first address. When a pulse occurs on the line T36, the comparison is performed and at this time it means nothing. However, the pulse on line T36 passes through the AND-circuit 1G40 in view of the fact that the flipflop 1F40 is set with its 1-output alerting the AND-circuit via the OR-circuit 4B40. Thus, the counter is incremented to the third address. When the pulse occurs on the line T37, the flip-flop 1F40 is cleared and also a pulse is sent on the line ST44 to activate the scanner 44. It should be noted that all remaining cycles operate in the same way except that the alerting of the AND-circuit 1G40 is from the line KO via the OR-circuit 4B40. Thus, it is seen that for every cycle of operation, there is written in the presently available memory cell and the next occurring available memory cell of memory 42 the contents of the memory cell being read from the memory 30. This is followed by a decrementing of the counter to the memory cell just prior to that written into so that a comparison can be performed. Thereafter, there is an incrementing back to said available memory cell and whether the incrementing beyond that available memory cell is possible, is determined by the results of the comparison. In essence at the start of the sequence memory cell n is available. There is writing in memory cells n and n+1 followed by a stepping back to memory cell n−1 for reading. The contents of cell n−1 are compared with the cell of memory 30 along with a stepping to cell n of memory 42. Whether or not there is a stepping to cell n+1 is determined by the results of the comparison.

Figure 7:
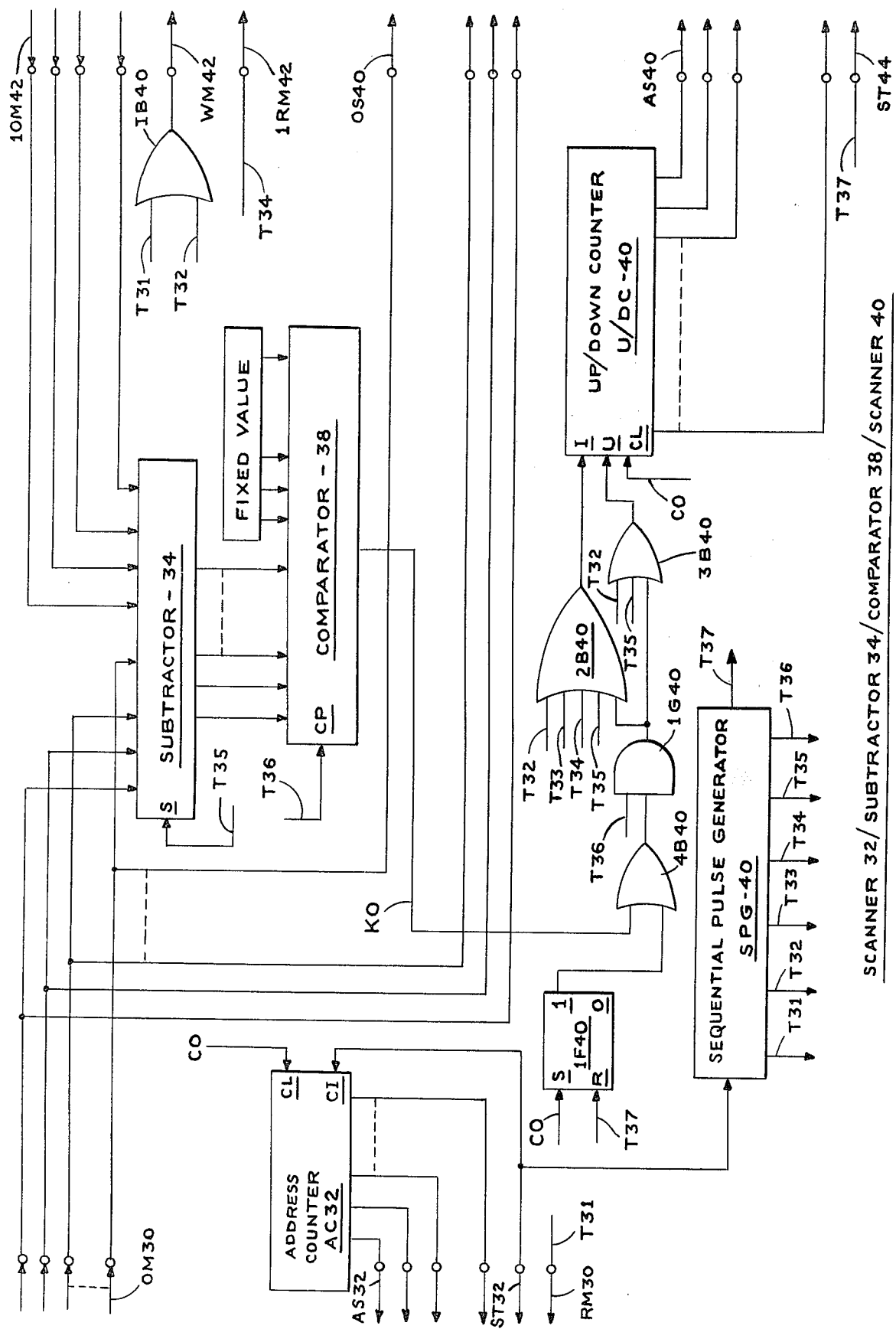
FIG. 7 is a detailed logic diagram of the scanner 32 subtractor 34, comparator 38 and scanner 40 combination shown in FIG. 4.

The scanner 44, averager 46 and scanner 48 are similar to the combination shown in FIG. 6 except that now the averaging will be over two values. Accordingly, there will be only two add-cycles and only the least significant bit of the output of the accumulator will be ignored. The scanner 52 can be similar to the scanner 32 of FIG. 7. The memories 22, 30, 42 and 50 can be all random access memories which are initially cleared by a pulse on line C zero. The tablet 10 can be of the type such as, Summographic Tablet, the control unit 11 is merely the equivalent of a retriggerable delay multivibrator which if it does not receive a pulse for a given period of time such as 30 msec. it will emit a pulse on line CO. The recognition device 18 can take many forms wherein the digital values are processed to determine the nature of the strokes.

There has thus been shown an embodiment of the invention utilizing all hardware. Such an embodiment is preferred when speed of operation is the desired goal. If speed of operation is not essential and if sufficient memory capacities available at reasonable cost the filtering can be performed by using a microprocessor which has been programmed to perform the same operations.

Again it should be realized that the invention was described with respect to one-dimensional stroke analysis. It would be used normally with two dimensions, but since the operation on the other dimension would be roughly the same, it is not shown merely for simplicity. The main difference would be determining the fixed value criteria for the comparator 38. Furthermore, it should be realize that the invention can be used to process other indicia such as that occurring in audio, seismic, SONAR or radar signal processing.

While only a limited number of embodiments have been shown and described there will now be obvious to those skilled in the art many modifications and variations satisfying many or all aspects of the invention without departing from the spirit thereof.

What is claimed is:

1. The method of filtering a signal represented by a first series of indicia wherein each indicium of the series represents the amplitude comprising the steps of serially averaging the amplitudes of the indicia of sets of indicia of the first series wherein each set includes a given number n of indicia, n being a positive integer less than the number of indicia in the first series of indicia, to form a second series of indicia and serially amplitude comparing each subsequently occurring indicium of the second series with a previously occurring indicium thereof to form a third series of indicia comprising those indicia which result in comparisons having an amplitude difference greater than a predetermined amount.

2. The method of claim 1 further comprising the step of serially averaging the amplitudes of indicia in sets of indicia of the third series wherein each set includes a given number p of indicia, p being a positive integer less than the number of indicia in the third series.

3. The method of claim 2 wherein each set of indicia includes some indicia from adjacent sets.

4. The method of claim 2 wherein one set of the first series includes n−1 indicia of an adjacent set of the first series.

5. The method of claim 2 wherein at least the first indicium of the third series is equal to the value of the first indicium of the first series.

6. The method of filtering a signal represented by a first series of indicia wherein each indicium of the series represents an amplitude comprising the steps of serially amplitude comparing each subsequently occurring indicium of the series with a previously occurring indicium thereof to form a second series of indicia comprising those indicia which result in comparisons having an amplitude difference greater than a predetermined amount and serially averaging the amplitudes of sets of indicia of the second series wherein each set includes a given number n of indicia, n being a positive integer less than the number of indicia in the series, to form a third series of indicia.

7. Apparatus for filtering a signal represented by a series of periodically occurring digital values comprising: first storage means for storing a plurality of digital values in a sequential array of cells; first scanning means for controlling the transfer of the digital values to said first storage means so that the digital values are loaded sequentially into the array of cells in accordance with the time of occurrence of the digital values; digital value averaging means having input means for receiving n digital values and output means for emitting a digital value which is an average of the n input values; second scanning means for controlling the transfer of sequential sets of n digital values from n sequentially adjacent cells of said first storage means to the input means of said digital value averaging means; second storage means for storing a plurality of digital values in a sequential array of cells; third scanning means for controlling the transfer of the digital values from said digital value averaging means to said second storage means so that the digital values are loaded sequentially into the array of cells in accordance with the time of emission of the digital values by said output means; comparator means having first and second inputs and an output for emitting a stepping signal whenever the difference in the digital values at said inputs is greater than a predetermined amount; fourth scanning means having input means connected to said second storage means and an output means connected to the first input of said comparator means for sequentially transferring the digital values from the sequential array of cells of said second storage means; third storage means for storing a plurality of digital values in a sequential array of cells; and fifth scanning means having first input means connected to the output means of said fourth scanning means, second input means for receiving digital values from adjacent cells of said third storage means, first output means connected to said first input means for transferring digital values to said third storage means, second output means connected to the second input of said comparator means for transferring digital values thereto from the second input means of the fifth scanning means and control means connected to the output of said comparator means and responsive to the stepping signals for causing said first output means and said second input means to stepwise actively communicate with adjacent pairs of cells of said third storage means.

8. The apparatus of claim 7 further comprising a utilization device, another digital averaging means having input means for receiving p digital values and output means for emitting a digital value which is an average of the p input values; a sixth scanning means for controlling the transfer of sequential sets of p-digital values from p sequentially adjacent cells of said third storage means to the input of said other digital value averaging means; and means for controlling the sequential transfer of the digital values from said other digital value averaging means to said utilization device.

9. The apparatus of claim 7 or 8 wherein said first scanning means further comprises means for loading into the first n cells of said first storage means the first digital value of the series of periodically occurring digital values representing the signal to be filtered.

10. The apparatus of claim 8 wherein said fifth scanning means further comprises means for loading into the first p cells of said third storage means the first digital values of the series of periodically occurring digital values representing the signal to be filtered.

11. Filtering apparatus for connecting a tablet which emits a series of digital values representing the positions of a stylus during a stroke on the tablet to a recognition processor, said apparatus comprising means for serially averaging the amplitudes of sets of n contiguous digital values in the series emitted by the tablet to form another series of digital values and means for serially amplitude comparing each subsequently occurring digital value of the other series with a previously occurring digital value thereof to form a further series of those digital values which result in comparisons having an amplitude difference greater than a predetermined amount.

12. The apparatus of claim 11 further comprising another means for serially averaging the amplitudes of sets of p contiguous digital values of said further series to form a still further series of digital values for transmission to the recognition processor.

* * * * *